(12) United States Patent
Tseng et al.

(10) Patent No.: US 7,972,912 B2
(45) Date of Patent: Jul. 5, 2011

(54) METHOD OF FABRICATING SEMICONDUCTOR DEVICE

(75) Inventors: Huai-Yuan Tseng, Taoyuan County (TW); Chen-Pang Kung, Taoyuan County (TW); Horng-Chih Lin, Hsinchu (TW); Ming-Hsien Lee, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 230 days.

(21) Appl. No.: 12/353,236

(22) Filed: Jan. 13, 2009

(65) Prior Publication Data
US 2009/0130804 A1    May 21, 2009

Related U.S. Application Data

(62) Division of application No. 11/470,627, filed on Sep. 7, 2006, now Pat. No. 7,504,694.

(30) Foreign Application Priority Data

May 16, 2006    (TW) ................................ 95117253 A

(51) Int. Cl.
*H01L 21/00* (2006.01)
(52) U.S. Cl. .................. 438/163; 438/164; 257/E21.415
(58) Field of Classification Search .................. 438/164, 438/162, 163, 166; 257/E21.415
See application file for complete search history.

(56) References Cited

U.S. PATENT DOCUMENTS

| 5,986,306 A * | 11/1999 | Nakajima et al. ............. 257/353 |
| 7,393,733 B2 * | 7/2008 | Currie ............................ 438/164 |
| 2003/0066740 A1 * | 4/2003 | Inukai .......................... 200/11 D |

* cited by examiner

*Primary Examiner* — Michael Trinh
(74) *Attorney, Agent, or Firm* — Jianq Chyun IP Office

(57) ABSTRACT

A method of fabricating a semiconductor device includes first providing an insulation substrate. A patterned conductive layer is formed over the insulation substrate, and the patterned conductive layer includes a channel region and a number of protruding regions. A gate structure layer is formed over the insulation substrate. The gate structure layer covers a part of the patterned conductive layer, and each of the protruding regions has an exposed region. A doping process is performed to dope at least the exposed region of the patterned conductive layer to form a number of S/D regions.

8 Claims, 12 Drawing Sheets

METHOD OF FABRICATING SEMICONDUCTOR DEVICE

CROSS-REFERENCE TO RELATED APPLICATION

This application is a divisional of and claims priority benefit of an application Ser. No. 11/470,627, filed on Sep. 7, 2006, now allowed as U.S. Pat. No. 7,504,694, which claims the priority benefit of Taiwan application serial no. 95117253, filed on May 16, 2006. The entirety of each of the above-mentioned patent applications is hereby incorporated by reference herein and made a part of this specification.

BACKGROUND OF THE INVENTION

1. Field of Invention

The present invention relates to a semiconductor device. More particularly, the present invention relates to a semiconductor transistor for testing, which is compatible with fabrication process of common semiconductor devices and can be achieved without additional processing steps, and thus the deterioration of various internal portions of the device under electrical stress can be conveniently detected.

2. Description of Related Art

In recent years, since flat panel displays have been gradually popularized and have replaced traditional CRT screens, thin-film transistor liquid crystal display (TFT-LCD) related industries are developing rapidly. Among others, the thin-film transistor (TFT), a crucial component, turns out to be one of the most important subjects currently.

It is generally known that the active region of a TFT comprises polysilicon silicon or amorphous silicon rather than single-crystal silicon, thus having a number of defects which lead to many problems, such as reliability. Therefore, it is urgent to improve the reliability of TFTs.

The active region of a TFT, also known as the channel region, is the region below the gate structure. Conventionally, in order to detect the deterioration of the channel region under persistent operating voltage, a set of test operating voltages is applied to electrodes of the gate, source, and drain, so as to generate an electrical stress on the transistor. After applying the electrical stress for a period of time, a characteristic curve of the transistor is tested to detect the change of the characteristics of the transistor caused by applying the electrical stress.

However, in addition to the fact that additional processes are required to fabricate the transistor for testing, the conventional detecting method can only test the overall structure of the transistor, and cannot detect various portions of the channel region due to the structure of the transistor for testing. Therefore, the conventional detecting method may cause wrong judgment. One of the possible situations is that, for example, a part of the channel region has been deteriorated. However, as for the overall testing, only a slight deviation occurs, and cannot indicate the existence of deteriorated portion. Thus, the conventional detecting result may lead to a wrong judgment.

SUMMARY OF THE INVENTION

The present invention provides a structure of semiconductor device and a method of fabricating the same. The semiconductor device structure comprises a special S/D electrode structure, which can be used to completely detect the deterioration of the device with simple analysis, thus facilitating the research and development of improving the reliability of the device.

The present invention provides a structure of semiconductor device, which comprises an insulation substrate. A channel layer is disposed on the insulation substrate. A plurality of doped layers is disposed on the insulation substrate, and protrudes from the channel layer. The doped layers form at least two S/D electrode pairs, and each of the S/D electrode pairs has a different extension direction with respect to the channel layer. A gate dielectric layer is disposed on the channel layer. A gate layer is disposed on the gate dielectric layer.

In the aforementioned device structure according to an embodiment of the present invention, for example, the extension direction of at least one of the S/D electrode pairs is a first direction, and the extension direction of at least another one of the S/D electrode pairs is a second direction. For example, the first direction is perpendicular to the second direction.

In the aforementioned device structure according to an embodiment, for example, the first direction is a longitudinal direction of the channel layer, and the second direction is a transverse direction of the channel layer, and at least two S/D electrode pairs are arranged in the second direction.

In the aforementioned device structure according to an embodiment of the present invention, for example, the extension direction of each of the S/D electrode pairs comprises at least three directions.

The present invention further provides a method of fabricating the semiconductor device, which comprises providing an insulation substrate. A patterned conductive layer is formed over the insulation substrate, wherein the patterned conductive layer comprises a channel region and a plurality of protruding regions. A gate structure layer is formed above the insulation substrate, and covers a part of the patterned conductive layer, wherein each of the protruding regions has an exposed region. A doping process is performed to dope at least the exposed region of the patterned conductive layer to form a plurality of S/D regions.

In the aforementioned method of fabricating the device structure according to an embodiment of the present invention, for example, the extension direction of at least one of the S/D electrode pairs is a first direction, and the extension direction of at least another one of the S/D electrode pairs is a second direction. For example, the first direction is perpendicular to the second direction.

In order to make the aforementioned and other features and advantages of the present invention comprehensible, embodiments accompanied with figures are described in detail below.

DESCRIPTION OF EMBODIMENTS

The present invention provides a structure of semiconductor device and a method of fabricating the same. The semiconductor device structure comprises a special S/D electrode structure, which can be used to completely detect the deterioration of the device with simple analysis, thus facilitating the research and development of improving the reliability of the device.

In the present invention, a plurality of S/D electrodes is disposed on the periphery of the channel region. Any two of the S/D electrodes form an S/D electrode pair, and the S/D electrode pair and a gate form a TFT, so as to detect or apply electrical stress to the channel region in the extension direction of the two S/D electrodes. Several embodiments are described below to illustrate the present invention. However, the present invention is not limited to the embodiments given below.

Figure 1A:
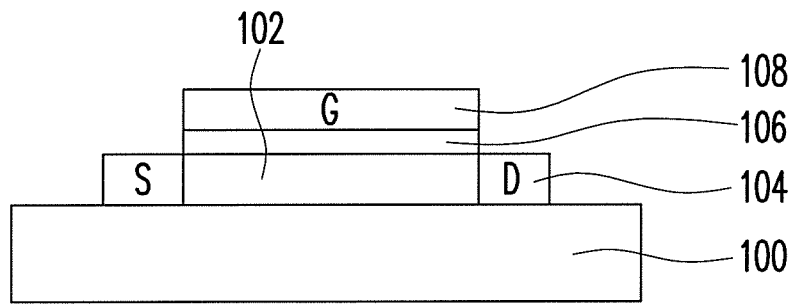
FIG. 1A is a schematic sectional view of the structure of semiconductor device according to an embodiment of the present invention.
Figure 1B:
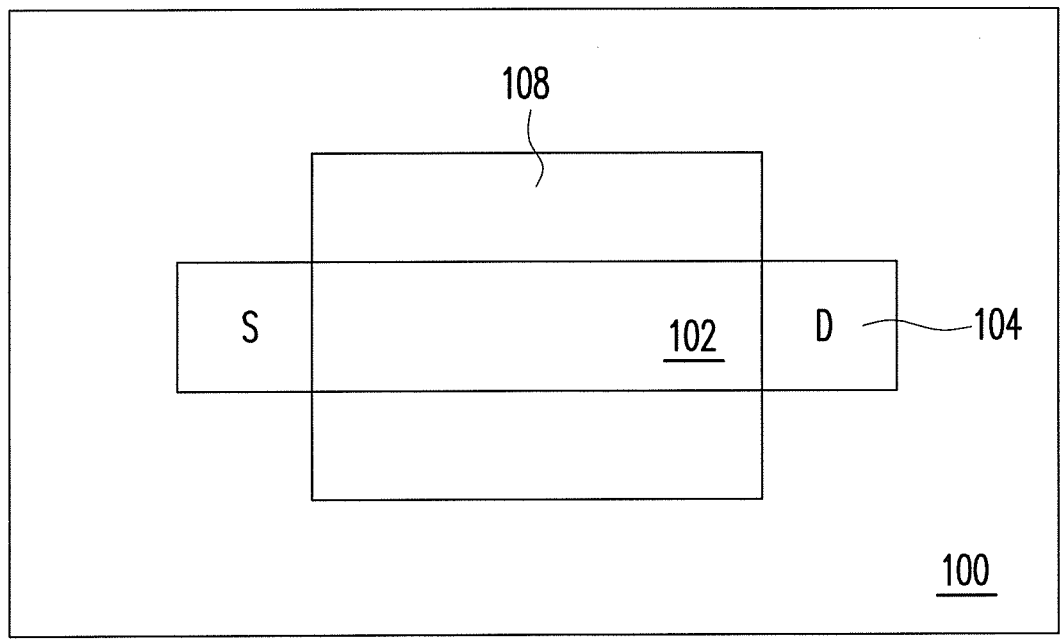
FIG. 1B is a schematic top view of the structure of semiconductor device according to an embodiment of the present invention.

FIG. 1A is a schematic sectional view of the structure of semiconductor device according to an embodiment of the present invention. FIG. 1B is a schematic top view of the structure of semiconductor device according to an embodiment of the present invention. Referring to FIGS. 1A and 1B, the structure of the semiconductor device mainly comprises a channel layer 102 disposed on a substrate 100. The substrate 100 is an insulation substrate, for example, a silicon oxide insulation substrate. The channel layer 102 is, for example, a polysilicon layer. A protruding portion 104 is disposed on the periphery of the channel layer 102, and the protruding portion 104 is, for example, two doped S/D electrodes 104 which form an S/D electrode pair. It should be noted that the channel layer 102 and the S/D electrodes 104 are preferably a single structural layer, and can be defined in the same photolithographic and etching processes, which can be known from the description of the process below. A gate structure layer, comprising a gate dielectric layer 106 and a gate layer 108, is formed over the substrate 100 and covers the channel layer 102. The gate layer 108 for example can be a polysilicon layer or a metal layer. For example, the gate layer 108 and the S/D electrodes 104 can be doped with the dopant such as an N-type dopant or a P-type dopant in the same doping process.

Only two S/D electrodes 104 are taken as an example to illustrate the structure as shown in FIG. 1B, and thus there is only one detecting direction with respect to the channel layer 102, i.e., the extension direction of the two S/D electrodes 104, which is also known as a longitudinal direction. However, different regions of the channel layer 102 along the longitudinal direction cannot be detected.

Figure 2:
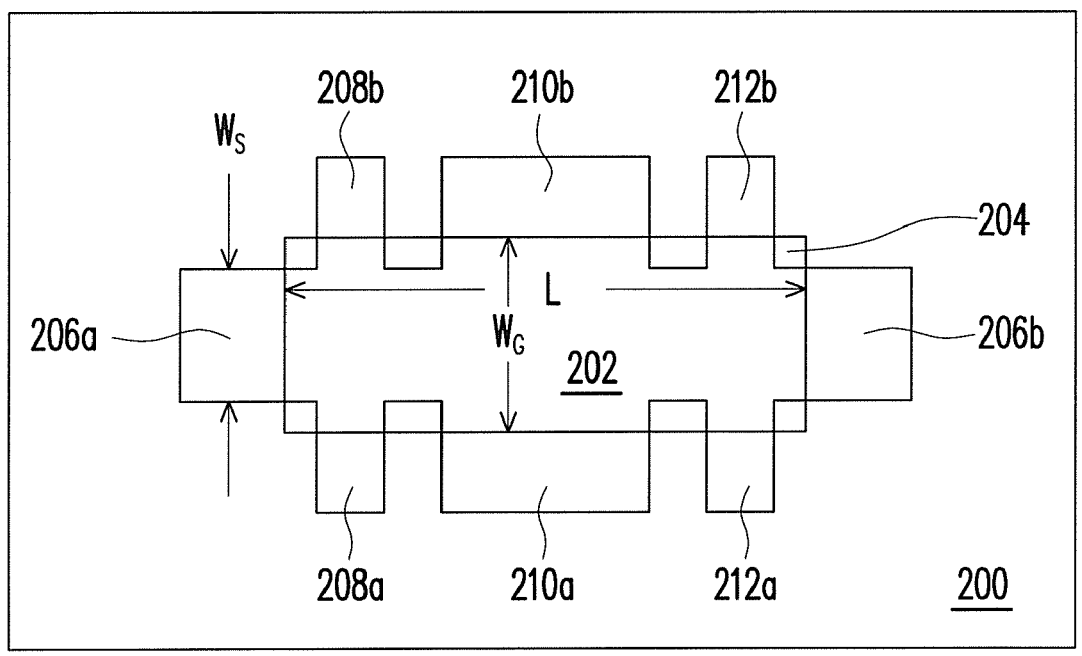
FIG. 2 is a schematic top view of the structure of semiconductor device according to another embodiment of the present invention.

Therefore, for the structure as shown in FIG. 1B, the present invention further provides an improved S/D electrode structure. FIG. 2 is a schematic top view of the structure of semiconductor device according to another embodiment of the present invention. Referring to FIG. 2, a sectional structure along an S/D electrode pair of FIG. 2 is similar to that of FIG. 1A. The structure has a channel layer 202 disposed on the substrate 200. A plurality of protruding regions is also disposed on the periphery of the channel layer 202. The protruding regions are doped layers serving as a plurality of S/D electrodes. Preferably, doped layers 206a, 206b form an S/D electrode pair. Doped layers 208a, 208b and doped layers 210a, 210b respectively form another S/D electrode pair. Moreover, doped layers 212a, 212b also form another S/D electrode pair. Then, a gate structure layer 204, comprising a gate dielectric layer and a gate layer, is formed over the substrate 200 and covers the channel layer 202.

Definitely, the constitution of the S/D electrode pairs can be different from that described above, and any two of the S/D electrodes can be selected to form an S/D electrode pair. In general, for example, an S/D electrode 206a and S/D electrode 210a can also form an S/D electrode pair, and meanwhile, S/D electrode 206a and S/D electrode 210b can also form another S/D electrode pair as well. However, the S/D electrode pair can also be arranged in two directions in practical design. For example, the extension direction of the S/D electrodes 206a and 206b is called the longitudinal direction, and the extension direction of the S/D electrodes 208a and 208b is called the transverse direction. Moreover, for example, the channel layer 202 is divided into several regions along the longitudinal direction. The S/D electrodes 210a and 210b, and S/D electrodes 212a and 212b are respectively added in the transverse direction to detect the deterioration of various regions correspondingly. Definitely, another S/D electrode pair can be arranged in the longitudinal direction, which is the variation of the present invention in practical design and the details will not be illustrated herein again. In other words, for example, the direction of the S/D electrode pairs can also comprise three or more directions.

The longitudinal direction refers to, for example, the direction of applying the electrical stress. The electrical stress can be generated by applying a voltage difference Vgs between the gate and the source, and meanwhile applying a voltage difference Vds between the drain and the source. After a period of time, the applied voltages are removed. Then, any two S/D electrodes are selected so as to measure the characteristics of the corresponding portions. Some of the results of actual measurement are shown in FIGS. 5A-5D and FIGS. 6A-6D, which will be illustrated later. An embodiment of the process of fabricating the aforementioned semiconductor structure is described below.

Figure 3A:
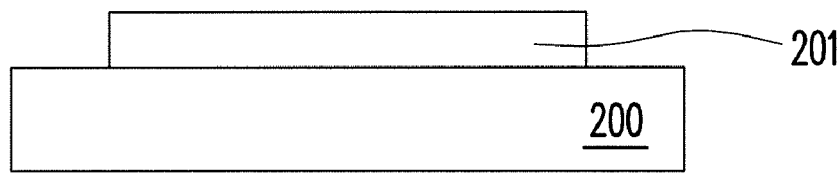
FIGS. 3A-3C are schematic sectional views of the process for fabricating the semiconductor device of FIG. 2 according to an embodiment of the present invention.
Figure 3B:
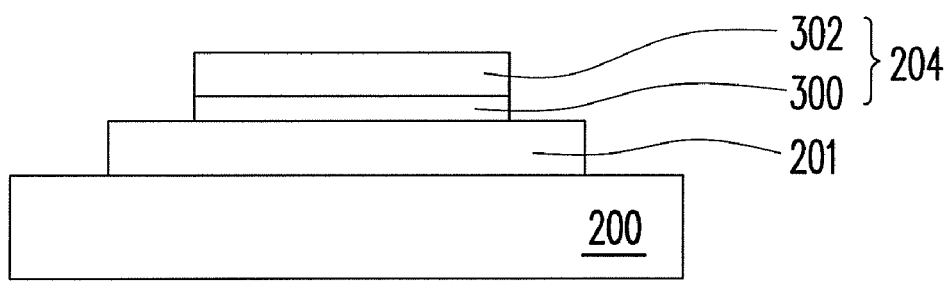
Figure 3C:
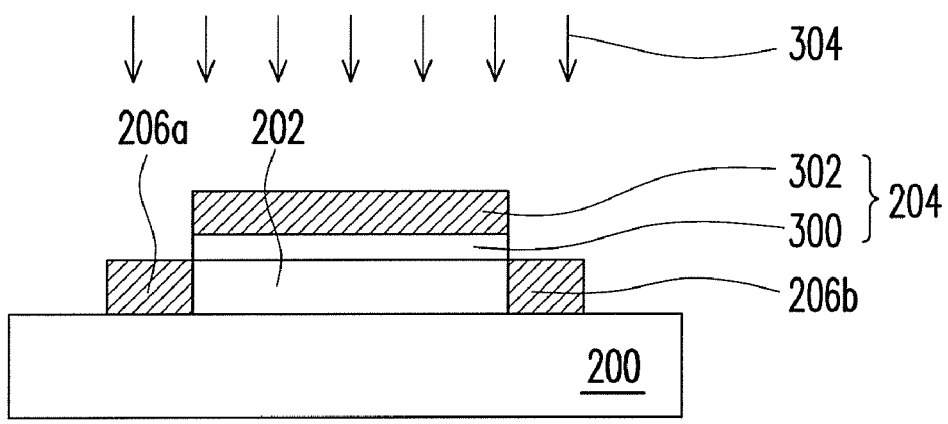

FIGS. 3A-3C are schematic sectional views of the process of fabricating the semiconductor device of FIG. 2 according to an embodiment of the present invention. Referring to FIG. 3A, an insulation substrate 200 is provided, and serves as a substrate layer. The insulation substrate 200 is, for example, a silicon oxide substrate. A conductive layer 201, for example a polysilicon layer, is formed over the substrate 200. The process for forming the conductive layer 201 is, for example, chemical vapor deposition (CVD). Then, the structure with a plurality of protruding regions 206a, 206b, 208a, 208b, 210a, 210b, 212a, and 212b on the periphery as shown in FIG. 2 can be defined in the conductive layer 201 through the photolithographic and etching process.

Referring to FIG. 3B, a gate dielectric layer and a gate layer are sequentially formed above the substrate 200, and are defined as a gate dielectric layer 300 and a gate layer 302 through the photolithographic and etching process. The gate dielectric layer 300 and the gate layer 302 form the gate structure layer 204 on the conductive layer 201. The gate structure layer 204 covers a part of the conductive layer 201, and the uncovered portion is predetermined to be a plurality of S/D electrodes which are formed subsequently.

Referring to FIG. 3C, a doping process 304 is performed to dope the gate layer 302 and the exposed portion of the conductive layer 201 with the dopants of the desired conductive type, so as to form the S/D electrodes 206a, 206b. Moreover, the covered region of the conductive layer 201 functions as the channel region 202, i.e., the active region of the transistor.

The structure of semiconductor device fabricated according to the above method can be used to conveniently detect the deterioration of the device. However, it should be noted that the fabricating method is compatible with the process of fabricating other common devices. Therefore, no additional process is required to fabricate the structure of semiconductor device of the present invention for testing, so the present invention basically does not cause an increase in the manufacturing cost.

Figure 4:
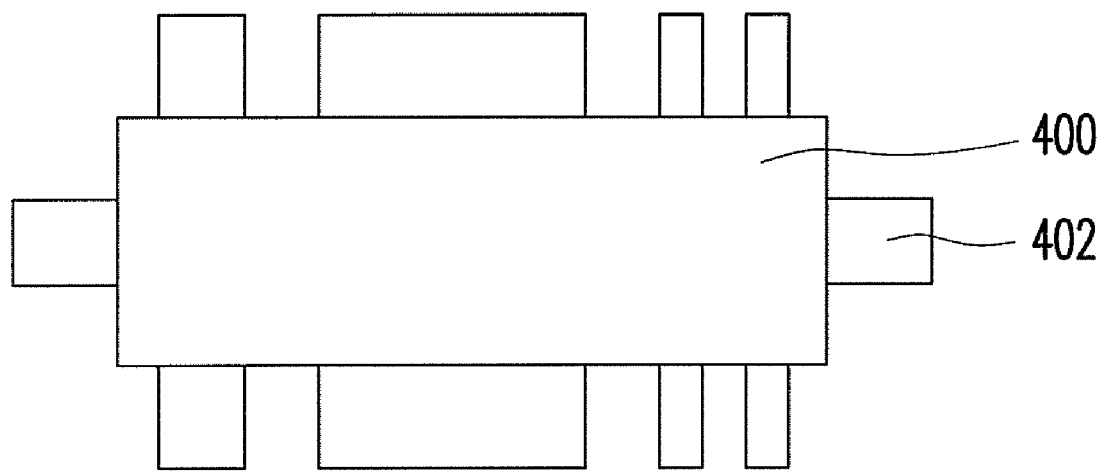
FIG. 4 is a schematic top view of the structure of semiconductor device according to another embodiment of the present invention.

According to the same fabricating process, S/D electrodes different from the above arrangement can be fabricated. FIG. 4 is a schematic top view of the structure of semiconductor device according to another embodiment of the present invention. As show in FIG. 4, the channel region below the gate structure 400 is, for example, an active region formed by polysilicon. A plurality of S/D electrodes 402 is disposed on the periphery of the channel region. Any two of the S/D electrodes can be selected to achieve an operation of the transistor, so as to measure the conducting currents of various portions or to test other parameters.

The special device structure provided by the present invention is applicable to analyzing the deterioration of various portions in the active region of the device being subjected to the electrical stress, and detecting the implied information that can not be observed by conventional reliability measurement. Thus, not only can the wrong judgment resulting from the conventional measurement be avoided, but also a structure design for improving the reliability of the device can be provided as reference.

Several examples of detecting the deterioration of various portions in the active region are given below, which show that the present invention provides more effective reliability analysis.

First, the applied conditions are described. Referring to FIG. 2 again, for example, the S/D electrodes 206a, 206b are taken as terminals being subjected to the electrical stress. A voltage Vg=10V is applied to the gate layer 302, and meanwhile a voltage Vd=20V is applied to the drain 206b, and the source 206a is connected to ground. Moreover, the aforementioned voltages are maintained for 1000 seconds. Then, the S/D electrodes 206a, 206b are divided, for example, into a source end portion, a middle portion, and a drain end portion along the longitudinal extension direction for analysis and test. The source end portion can be measured by the S/D electrodes 208a and 208b, the middle portion can be measured by the S/D electrodes 210a and 210b, and the drain end portion can be measured by the S/D electrodes 212a and 212b. In this embodiment, only one S/D electrode pair is taken as the example to illustrate the S/D electrodes in the longitudinal direction; however, it is not the only way. In the aspect of the common fabricating dimension, the transverse width of the channel region 202 is represented by Ws, which for example is 5 μm. Furthermore, the longitudinal length of the channel region 202 is represented by L, which for example is 10 μm. The width of the gate is represented by $W_G$, which for example is 7 μm. The lengths of the source end portion and the drain end portion in the longitudinal direction are, for example, 1 μm. The length of the middle portion is, for example, 7 μm.

Figure 5A:
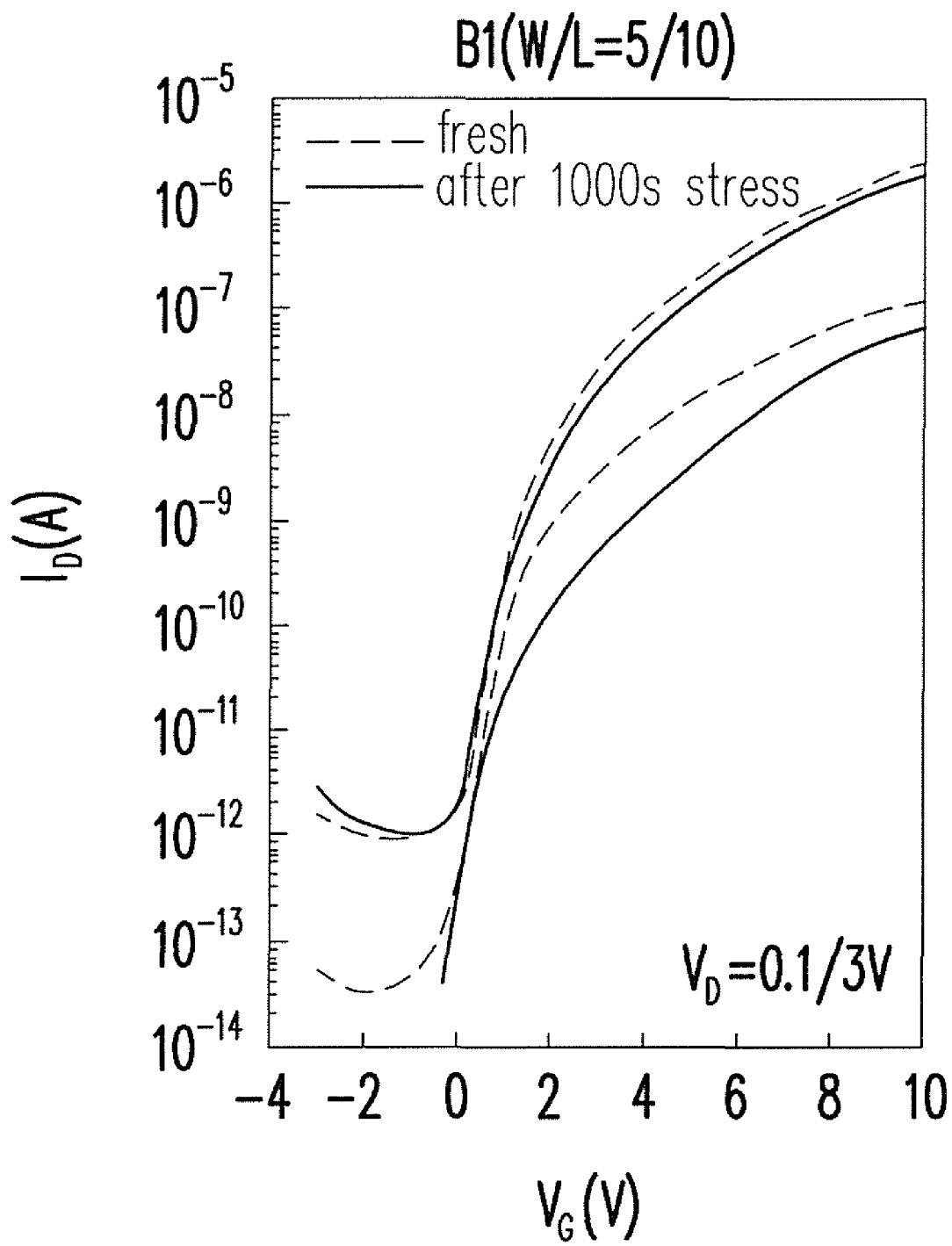
FIGS. 5A-5D show the observed changes of the transfer characteristic curves after applying an electrical stress according to an embodiment of the present invention.

FIGS. 5A-5D show the observed changes of the characteristic curves after applying an electrical stress according to an embodiment of the present invention. FIG. 5A shows the characteristic curve of conducting current $I_D$ to the gate voltage $V_G$ of the drain in the longitudinal direction measured by the S/D electrodes 206a, 206b, wherein $V_G$ indicates the gate voltage. The dashed line indicates the characteristic curve of the original semiconductor testing device before applying the electrical stress, and the solid line indicates the characteristic curve of the semiconductor testing device after applying the electrical stress. Moreover, the upper curve is under the condition that the voltage difference $V_D$ between the drain and the source is 3 V, and the lower curve is under the condition that $V_D$ is 0.1 V. As known from the characteristic curve of $I_D$ to $V_G$, when $V_D$=0.1 V, the deterioration is quite obvious, and when $V_D$=3 V, no distinct change can be observed.

Figure 5B:
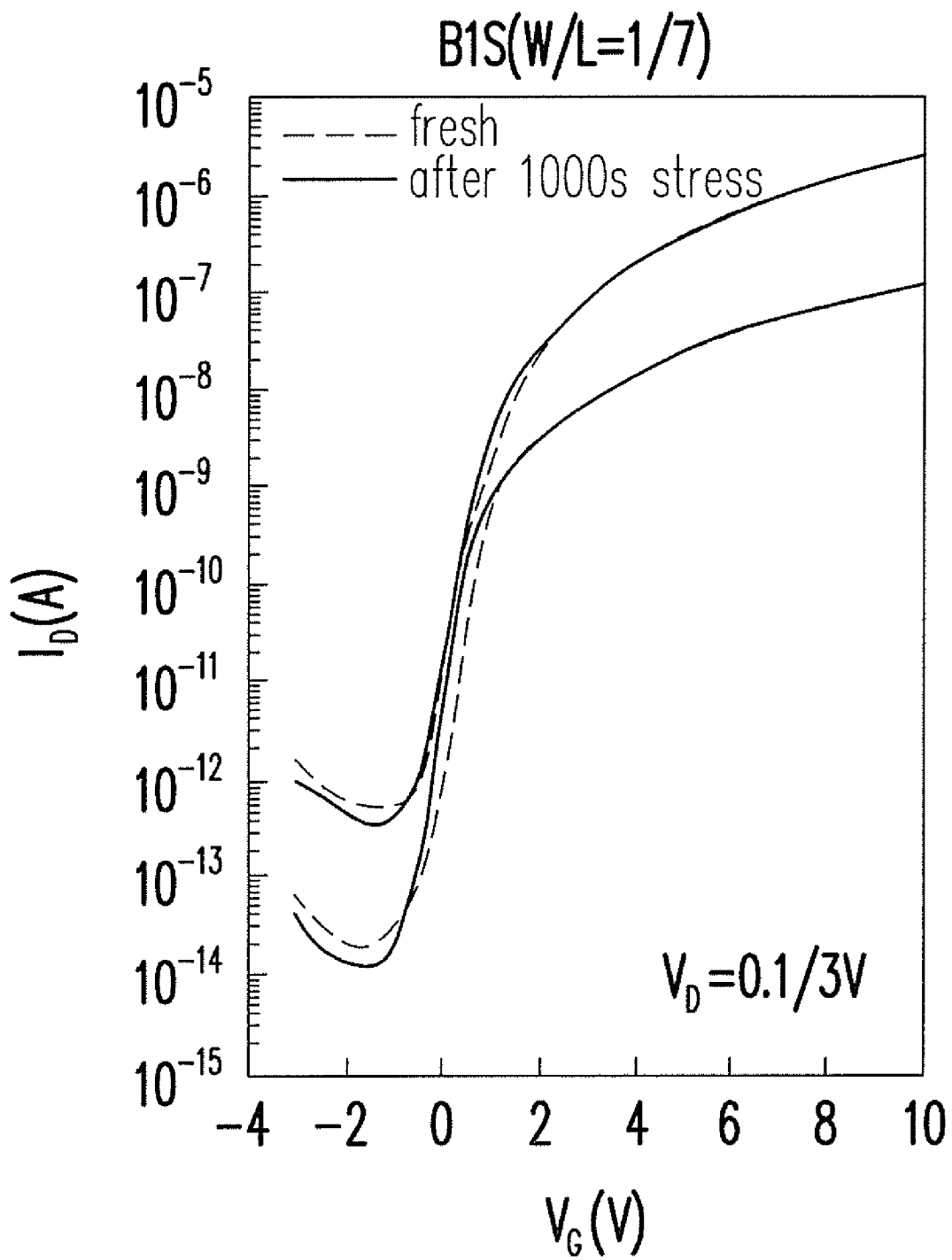
Figure 5C:
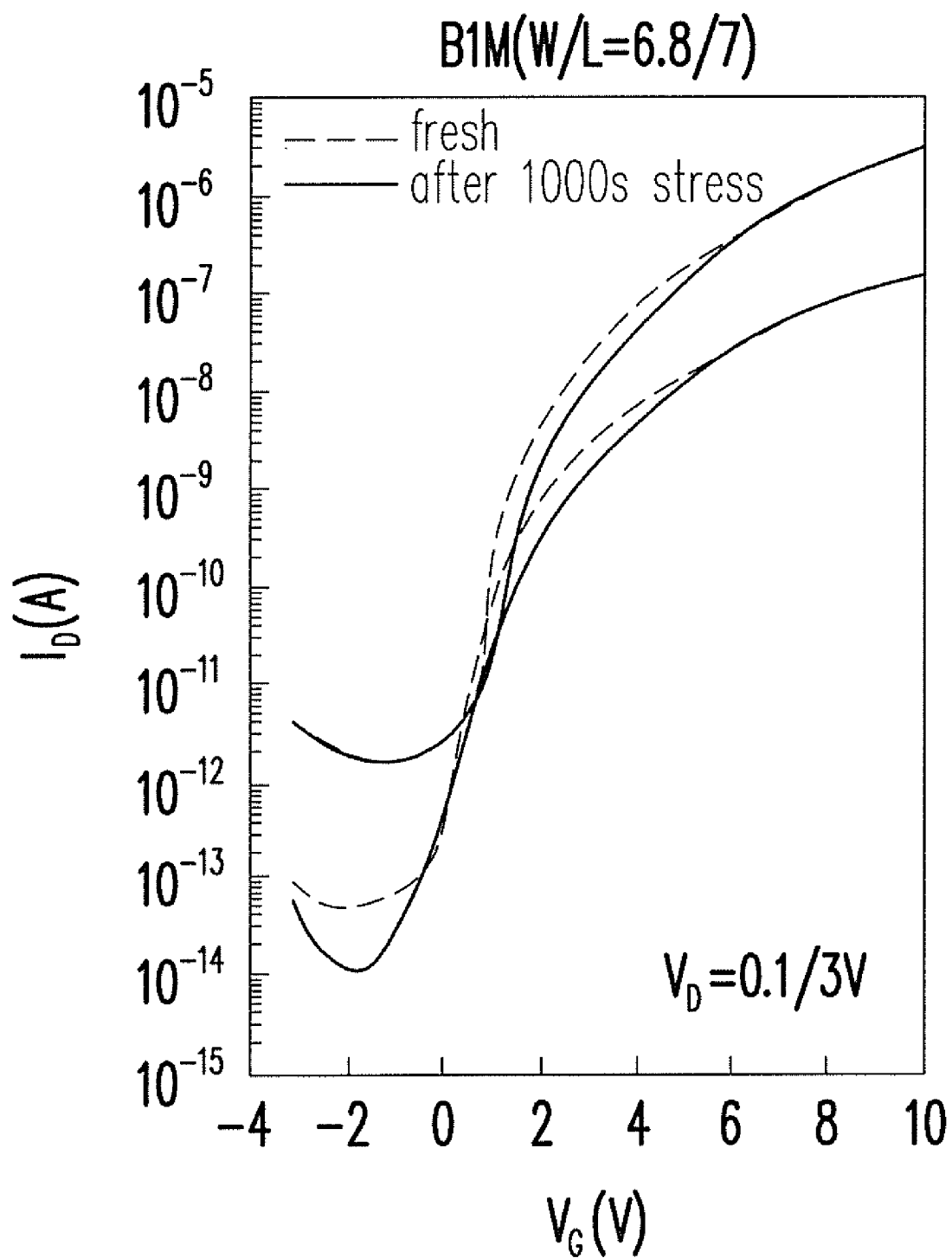
Figure 5D:
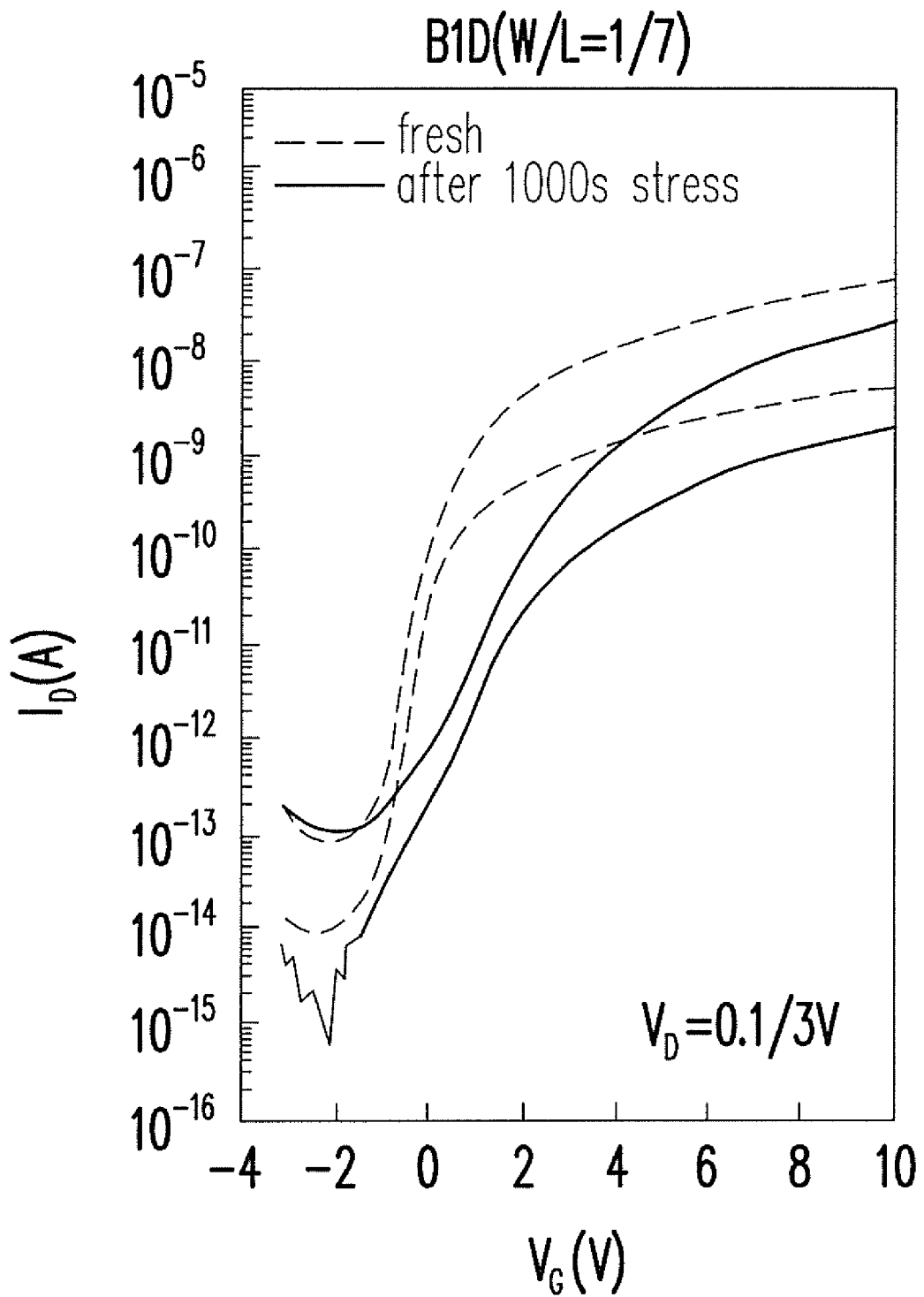

Then, the changes of the characteristic curves of $I_D$ to $V_G$ in other regions are tested subsequently. FIG. 5B is the measurement result of the source end portion. FIG. 5C is the measurement result of the middle portion. FIG. 5D is the measurement result of the drain end portion. Obviously, among the characteristics of the three regions, the middle portion and the drain end portion have distinct deterioration. It should be noted that, with referring to FIG. 5D and FIG. 5A, the drain end portion has serious deterioration no matter in $V_D$=0.1V or $V_D$=3V. However, in FIG. 5A, the deterioration is not obvious, and especially when $V_D$=3V, the data of FIG. 5A cannot show the deterioration of the drain end portion. But, as the present invention provides concurrent tests to several regions, the deteriorated regions can be precisely detected.

The reasons for the deterioration can be analyzed. The region near the drain electrode end 206b, also known as the B1D region, is measured by the S/D electrodes 212a and 212b. As shown in FIG. 5D, for example, since the sub-threshold and above threshold currents decrease significantly, two defects, namely the deep state and the tail state, occur in the polysilicon of the drain end region. The defect of deep state causes an increase in current leakage, which is also one of the main reasons of the increase of the current leakage, and thus the increase of the current leakage is observed. Then, the middle region, also known as the B1M region, is measured by the S/D electrodes 210a and 210b. It can be seen from the characteristics as shown in FIG. 5C that only the current of the sub-threshold region increases significantly. Thus, it can be concluded that only the deep state occurs in the middle region. The region near the source end 206a, also known as the B1S region, is measured by the S/D electrodes 208a and 208b and has the characteristics as shown in FIG. 5B that the sub-threshold current increases and the current leakage decreases. Therefore, it can be concluded that the hole trapping occurs near the source electrode end. The deterioration of the polysilicon active region of a device can be fully understood through detailed analysis of the three regions. Thus, the reliability of the device can be improved according to the above information.

Figure 6A:
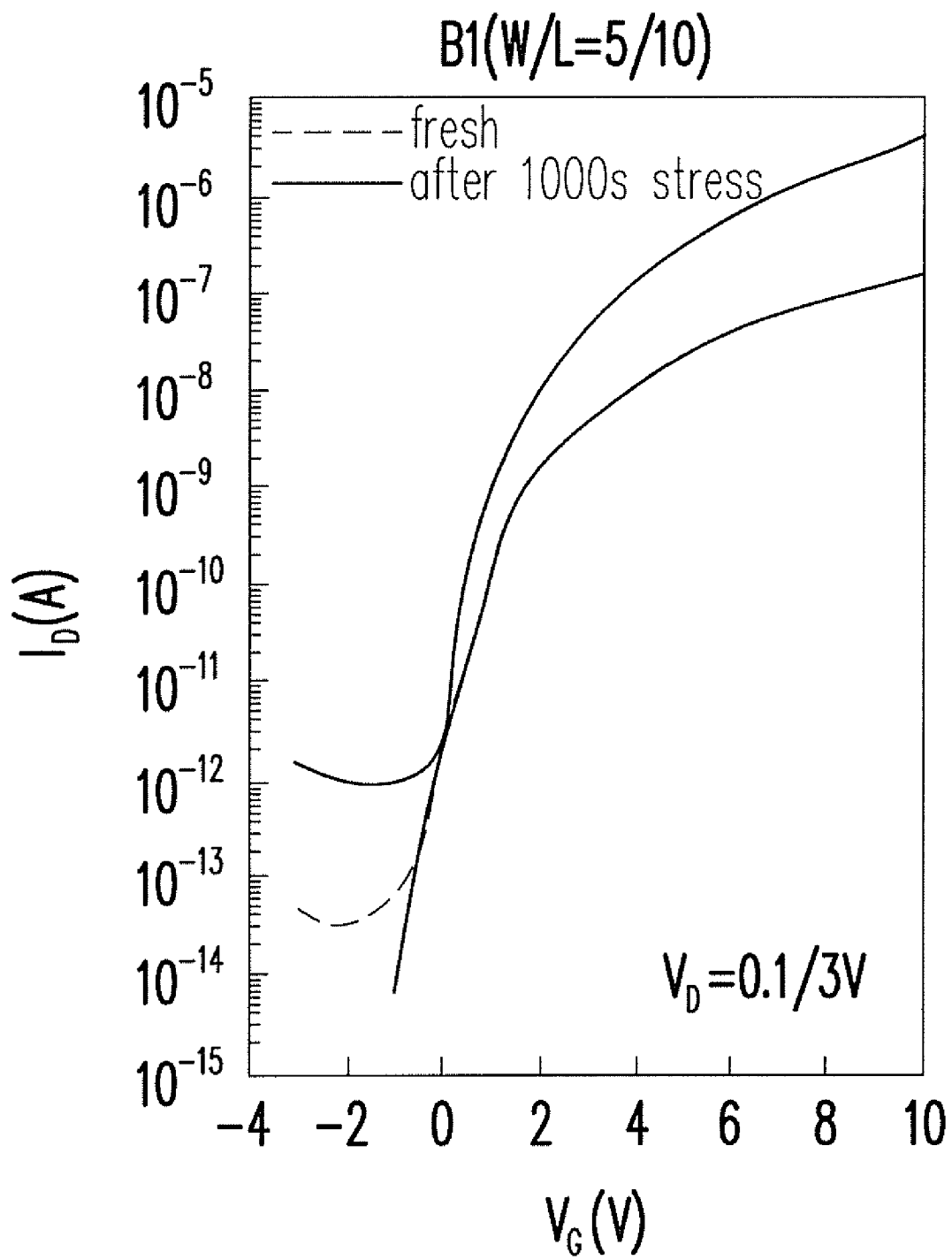
FIGS. 6A-6D show the observed changes of the transfer characteristic curves after applying an electrical stress according to an embodiment of the present invention.
Figure 6B:
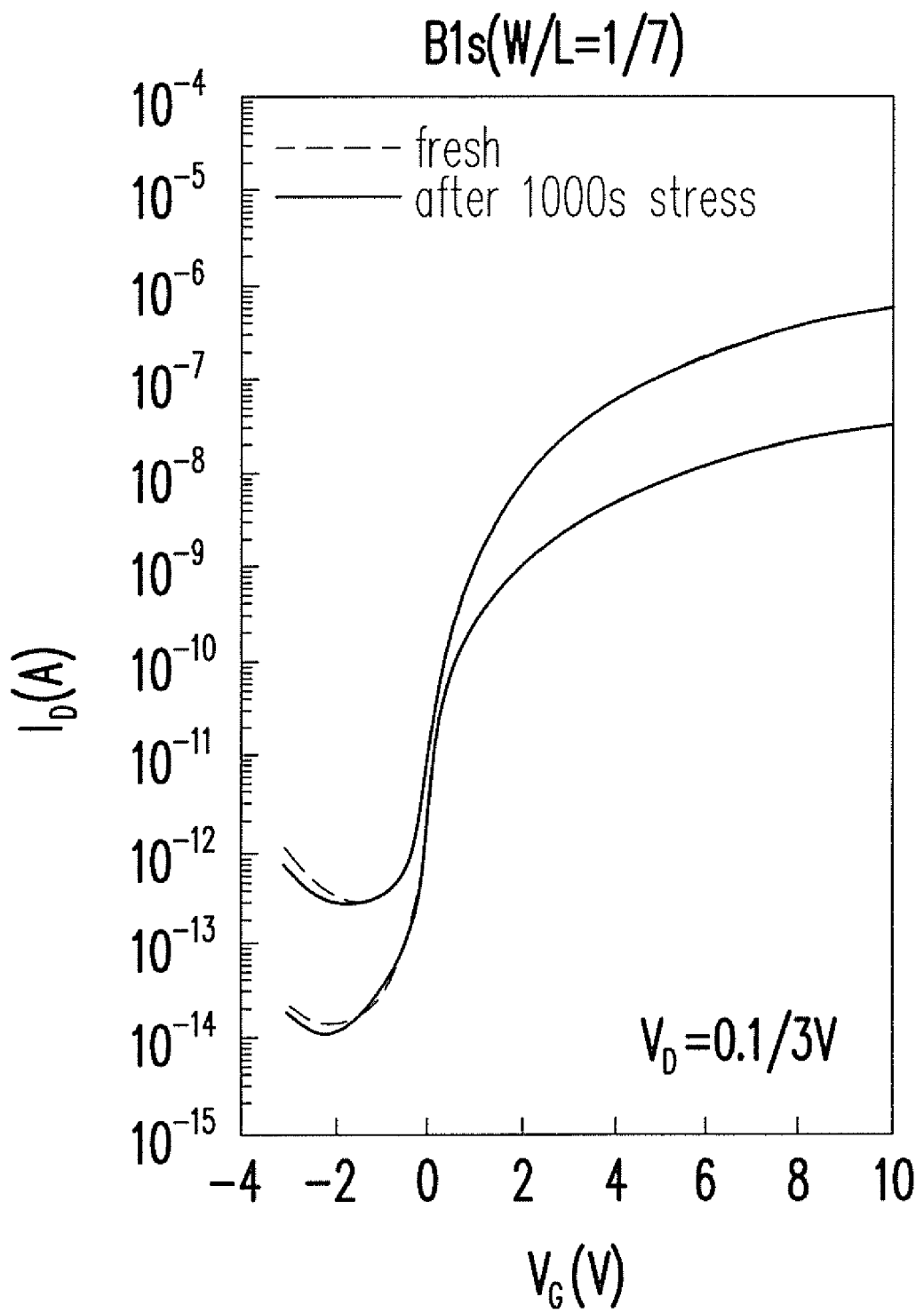
Figure 6C:
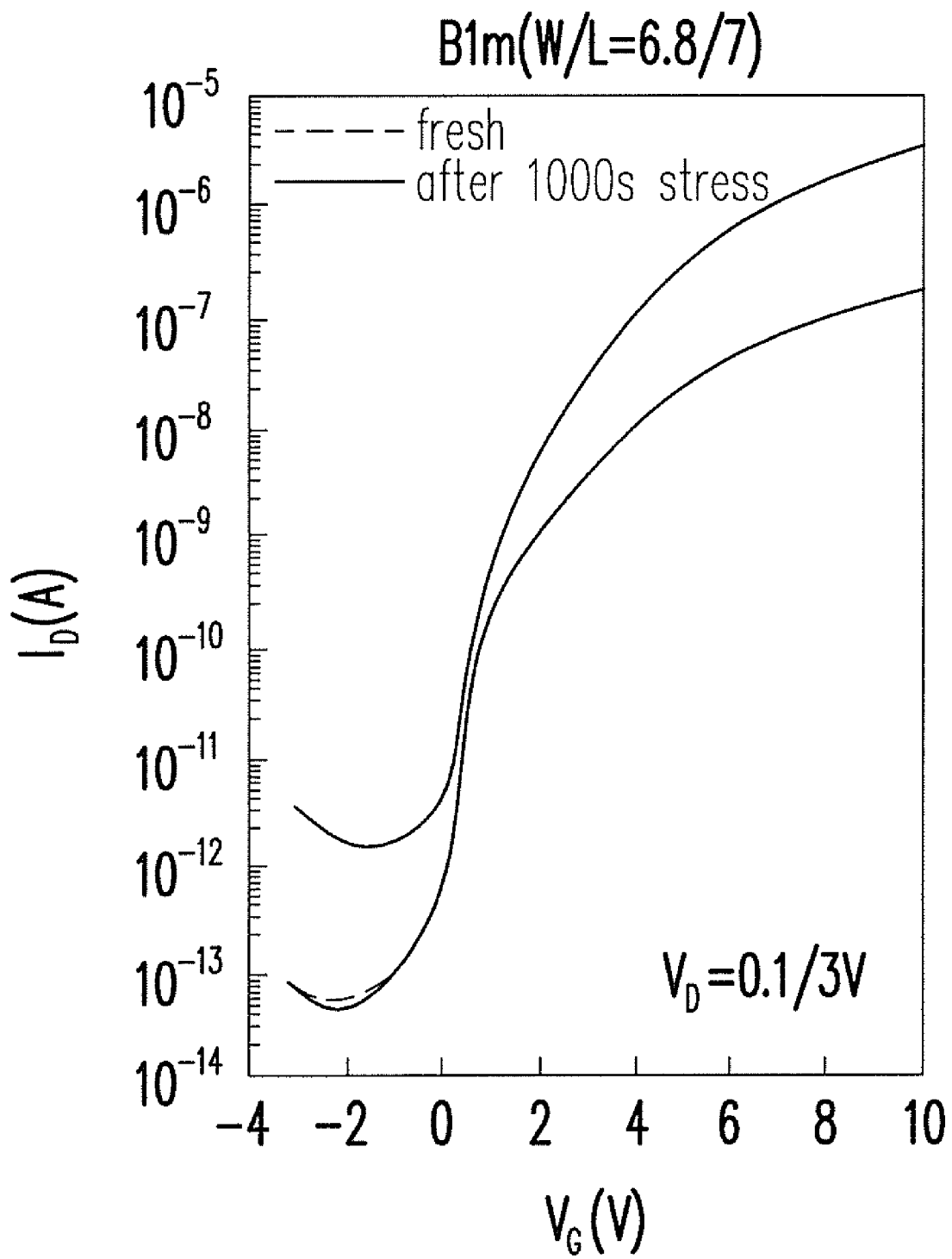
Figure 6D:
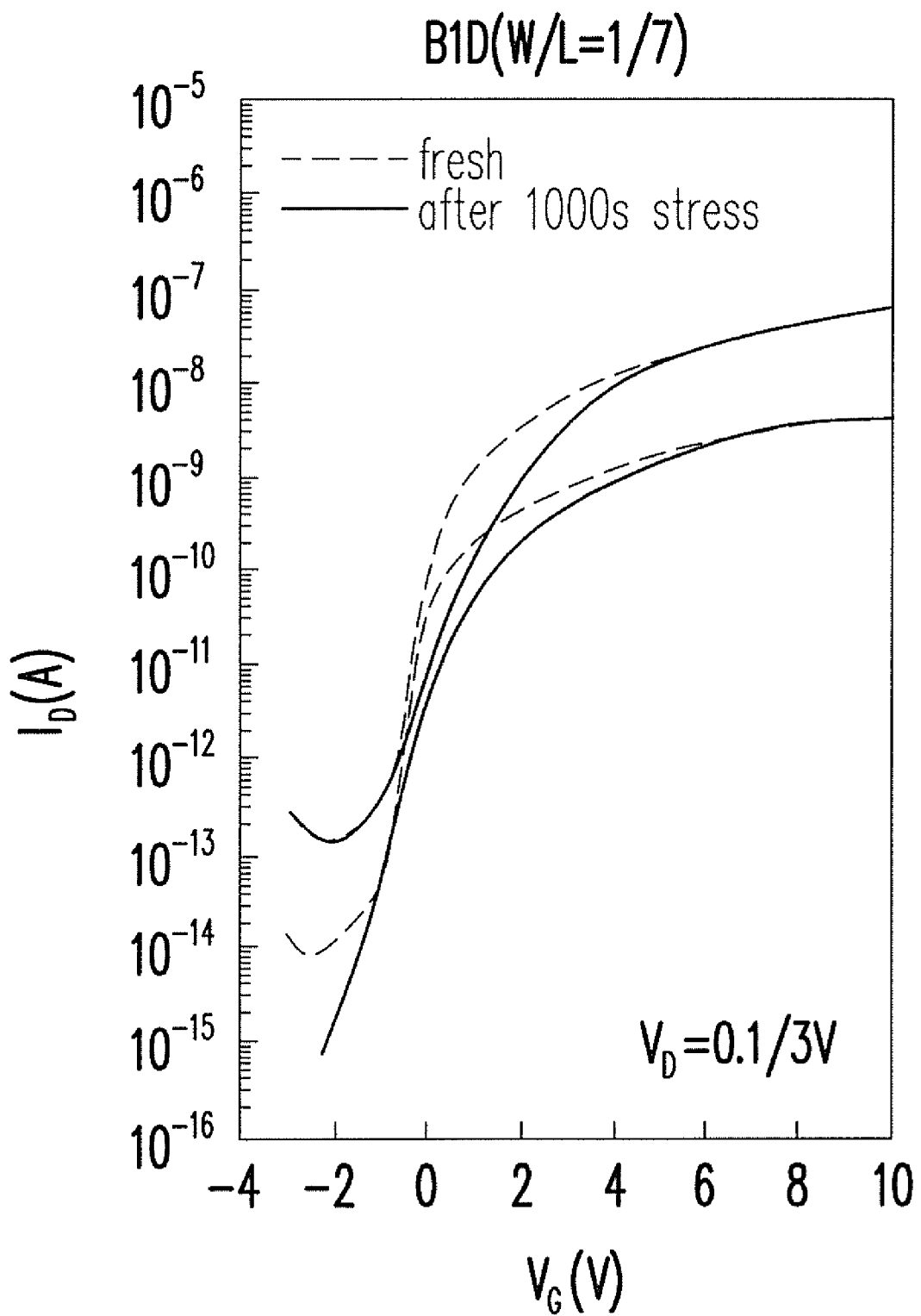

Furthermore, the precision that the device structure of the present invention determines the deterioration of the device can be understood from another measurement condition. The condition of the electrical stress is change to Vg=6V, Vd=12V, and Vs=0V, and the electrical stress is applied for 1000 seconds. Then, the longitudinal and transverse conductivity characteristics are measured, and the results are as shown in FIGS. 6A-6D. FIG. 6A is the conductive current along the longitudinal direction of the S/D electrodes 206a and 206b. FIGS. 6B-6D are similar to FIGS. 5B-5D, indicating the transverse conductive currents measured in three regions along the longitudinal direction. Comparing with FIG. 6A, no obvious change of sub-threshold, above threshold, and leakage currents occurs.

However, from the transverse conductivity characteristics of the three regions (B1S, B1M, B1D), it can be known that the polysilicon actually has the deterioration as shown in FIGS. 6B-6D. The characteristics of the corresponding source end (B1S) and the middle region (B1M) of FIGS. 6B and 6C are not deteriorated. However, as for the characteristics of the drain end (B1D) as shown in FIG. 6D, the sub-threshold and the saturated currents decrease, which shows that the polysilicon of the drain end has certain defects. As the defect cannot be effectively observed from the result as shown in FIG. 6A, the wrong judgment that the device is not subjected to the stress and has no deterioration may be made. After prolonged operation, the driving current of the device will be lower than the expected value, which leads to the abnormal operation when it is applied to the driver or the amplifier of the display.

Therefore, when the reliability test is preformed, the aforementioned structure provided by the present invention can be used to measure various portions to achieve precise analysis, which effectively improves the reliability of the product. Moreover, other tests and applications are also possible.

In addition, the measured parameters of FIGS. 5A-5D and FIGS. 6A-6D are only examples for illustrating the application of testing. The parameters to be measured can be changed according to the actual requirement. In other words, the semiconductor device provided by the present invention can be applied to various tests, and is not limited to the application described above.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a semiconductor device, comprising:

providing an insulation substrate;

forming a patterned conductive layer over the insulation substrate, wherein the patterned conductive layer comprises a channel region and a plurality of protruding regions;

forming a gate structure layer over the insulation substrate, wherein the gate structure layer covers a part of the patterned conductive layer, and each of the protruding regions has an exposed region; and performing a doping process to dope at least the exposed region of the patterned conductive layer to form a plurality of S/D regions, wherein the S/D regions form a plurality of S/D electrode pairs, at least one of the S/D electrode pairs extends in a first direction and at least two of the S/D electrode pairs extends in a second direction, wherein the first direction is a longitudinal direction of the channel region, and the second direction is a transverse direction of the channel region.

2. The method of fabricating the semiconductor device as claimed in claim 1, wherein the extension direction of each of the S/D electrode pairs comprises at least three directions.

3. The method of fabricating the semiconductor device as claimed in claim 1, wherein each of the S/D electrode pairs and the gate layer form a test thin-film transistor.

4. The method of fabricating the semiconductor device as claimed in claim 1, wherein the insulation substrate comprises a silicon oxide substrate.

5. The method of fabricating the semiconductor device as claimed in claim 1, wherein the patterned conductive layer comprises a polysilicon layer or an amorphous silicon layer.

6. The method of fabricating the semiconductor device as claimed in claim 1, wherein the gate structure layer comprises a gate layer or a gate dielectric layer.

7. The method of fabricating the semiconductor device as claimed in claim 6, wherein the gate layer comprises a polysilicon layer or a metal layer.

8. The method of fabricating the semiconductor device as claimed in claim 1, wherein the step of performing the doping process further comprises doping a gate layer of the gate structure layer at the same time.

* * * * *